United States Patent

Shakuda

[11] Patent Number: 5,814,533
[45] Date of Patent: Sep. 29, 1998

[54] SEMICONDUCTOR LIGHT EMITTING ELEMENT AND MANUFACTURING METHOD THEREFOR

[75] Inventor: Yukio Shakuda, Kyoto, Japan

[73] Assignee: Rohm Co., Ltd., Kyoto, Japan

[21] Appl. No.: 509,231

[22] Filed: Jul. 31, 1995

[30] Foreign Application Priority Data

| Aug. 9, 1994 | [JP] | Japan | .................................... | 6-187341 |
| Aug. 22, 1994 | [JP] | Japan | .................................... | 6-196851 |
| Aug. 22, 1994 | [JP] | Japan | .................................... | 6-196853 |
| Aug. 26, 1994 | [JP] | Japan | .................................... | 6-202479 |

[51] Int. Cl.$^6$ .......................... H01L 21/203; C30B 25/22
[52] U.S. Cl. ................. 438/46; 438/45; 438/47; 438/38
[58] Field of Search .................... 437/107, 129, 437/133, 946; 438/45, 46, 47, 565, 38

[56] References Cited

U.S. PATENT DOCUMENTS

| 4,855,249 | 8/1989 | Akasaki et al. | .......................... 437/133 |
| 5,076,860 | 12/1991 | Ohba et al. | .............................. 437/129 |
| 5,171,706 | 12/1992 | Matsumoto et al. | .................... 437/946 |
| 5,260,231 | 11/1993 | KawaNashi et al. | ................... 437/107 |
| 5,273,933 | 12/1993 | Hatano et al. | ........................... 437/129 |
| 5,290,393 | 3/1994 | Nakamura | ............................... 437/133 |
| 5,306,662 | 4/1994 | Nakamura et al. | ..................... 437/133 |
| 5,389,571 | 2/1995 | Takeuchi et al. | ....................... 437/133 |

*Primary Examiner*—Charles L. Bowers, Jr.
*Assistant Examiner*—Keith Christianson
*Attorney, Agent, or Firm*—Nikaido, Marmelstein, Murray & Oram LLP

[57] ABSTRACT

A manufacturing method of semiconductor light emitting element including the steps of: (a) laminating a gallium nitride compound semiconductor layer for forming a luminous part on a substrate including at least an n-type layer and a p-type layer, by organic metal compound vapor phase growth method, (b) forming the gallium nitride compound semiconductor layer in a nitrogen gas atmosphere after laminating, and lowering the ambient temperature to the temperature for growing a GaAs compound in vapor phase and annealing the p-type layer of the gallium nitride compound semiconductor, (c) forming a film of at least one type selected from the group consisting of GaAs, GaP, InAs, InP, all doped with Mg, and part of these group III elements replaces by Al. on the surface of the gallium nitride compound semiconductor layer, as a protective layer in the nitrogen atmosphere, and (d) annealing the p-type layer of gallium nitride compound semiconductor layer simultaneously with forming the protective film, and lowering to room temperature after annealing, and removing the protective film by etching.

7 Claims, 11 Drawing Sheets

SEMICONDUCTOR LIGHT EMITTING ELEMENT AND MANUFACTURING METHOD THEREFOR

BACKGROUND OF THE INVENTION

The present invention relates to a semiconductor light emitting element and manufacturing method therefor. More particularly, it relates to a semiconductor light emitting element for emitting light from the side exposed by etching vertically a laminate film of gallium nitride type compound semiconductor (hereinafter referred to as a "gallium nitride compound semiconductor") preferable for blue light emission, and manufacturing method therefor.

Herein, the gallium nitride compound semiconductor is a semiconductor composed of a compound of Ga of group III elements and N of group V elements, or a compound having part of Ga of group III elements replaced with other group III elements such as Al and In and/or having pat of N of group V elements replaced with other group V elements such as P and As.

The semiconductor light emitting element is a semiconductor element which emits light, such as light emitting diode (LED) having a double hetero junction such as pn junction and pin, a super-luminescent diode (SLD), and semiconductor laser diode (LD).

Hitherto, the blue LED was small in luminance as compared with red and green, and was far from practical, but recently, using gallium nitride compound semiconductor, a p-type semiconductor layer of low resistance doped with Mg was obtained, and the luminance was enhanced and it is drawing attention.

A light emitting element using gallium nitride compound semiconductor is of a structure, for example, as shown in FIG. 7. This light emitting element is manufactured in the process explained below by reference to FIG. 8.

First, as shown in FIG. 8(a), on a substrate 21 made of sapphire ($Al_2O_3$ single crystal) or the like, organic metal compound gases, trimethyl gallium (TMG) and ammonia ($NH_3$), are supplied together with carrier gas $H_2$ by organic metal compound vapor phase growth method (MOCVD method), and a low temperature buffer layer 22 composed of n-type GaN is formed by about 0.01 $\mu$m to about 0.2 $\mu$m, and a high temperature buffer layer 23 of n-type GaN of same composition is formed by about 2 $\mu$m to about 5 $\mu$m by feeding the same gases at a high temperature of 700° C. to 1200° C.

To these gases, further, a material gas of trimethyl aluminum (TMA) is introduced to form an n-type $Al_xGA_{1-x}N$ (0<x<1) film is formed, and an n-type clad layer 24 for forming a double hetero junction is formed by about 0.1 $\mu$m to about 0.3 $\mu$m. These n-type layers are formed by introducing Si as $SiH_4$ gas to the above gases.

In succession, a material of which band gap energy is smaller than that of the clad layer, for example, trimethyl indium (TMI) is introduced instead of TAM of the material gas, and an active layer 25 composed of $Ga_yIn_{1-y}N$ (0<y≦1) is formed by about 0.05 $\mu$m to about 0.1 $\mu$m.

Next, with the same material gas as used informing the n-type clad layer 24, as the impurity material gas, instead of $SiH_4$, an organic metal compound gas of biscyclopentadienyl magnesium ($Cp_2Mg$) or dimethyl zinc (DMZn) for Mg or Zn as p-type impurity is added and fed into a reaction tube, and a p-type clad layer 26 composed of p-type $Al_xGa_{1-x}N$ is formed. As a result, a double hetero junction is formed by the n-type clad layer 24, active layer 25, and p-type clad layer 26.

Moreover, to form a cap layer 27, using the same gases as in the buffer layer 23, $Cp_2Mg$ or DMZn is supplied as impurity material gas, and p-type GaN layer is grown in vapor phase by about 0.1 $\mu$m to about 2 $\mu$m.

Afterwards, $SiO_2$, $Si_3N_4$ and other protective films are provided on the entire surface of grown layer of the semiconductor (see FIG. 8(b)), and by annealing for about 20 minutes to about 60 minutes at 400° C. to 800° C. (see FIG. 8(c)), the p-type clad layer 26 and cap layer 27 are activated. This annealing is done for the following reason.

That is, the p-type layer of gallium nitride compound semiconductor is doped with Mg or other dopant, but Mg and the like react, at the time of doping with $H_2$ in the carrier gas or H in the reaction gas NH3, becoming high in electric resistance without acting as dopant. Accordingly, to separate Mg from H to release H to be low in electric resistance, the annealing step is provided.

Consequently, to form the n side electrode after removing the protective film 28, a resist is applied, and patterned, and, as shown in FIG. 8(d), part of each grown semiconductor layer is removed by dry etching, which is reactive ion etching by chlorine plasma, and the buffer layer 23 is exposed as n-type GaN layer. In the case of LD, by dry etching, the side of the semiconductor layer is etched so as to be a smooth surface vertical to the substrate surface. By forming metal films of Au, Al and others by sputtering, p side and n side electrodes 29, 30 are formed, and diced.

Further, for achieving an ohmic contact between Al or the like of electrode metal and gallium nitride compound semiconductor, an alloy is formed by heating at about 300° C. in $H_2$ atmosphere (see FIG. 8(e)).

The semiconductor light emitting element using gallium nitride compound semiconductor cannot be cleaved because sapphire substrate is contained, and is separated into chips by etching and dicing as mentioned above.

Hitherto, the attention was paid only to matching between the sapphire substrate 1 and gallium nitride compound semiconductor, plane C of sapphire crystal was used as the principal plane, and in the gallium nitride compound semiconductor, its (0001) plane is a growth plane in epitaxial growth, and the side of the chip individualized by etching and dicing is other plane than this (0001) plane.

In the conventional manufacturing method of semiconductor light emitting element using gallium nitride compound semiconductor, as mentioned above, annealing is done after forming a protective film such as $SiO_2$ on the surface of the semiconductor layer, but formation of protective film such as $SiO_2$ is done by a CVD apparatus different from the MOCVD apparatus, and therefore by once lowering the temperature to room temperature after forming the MOCVD, it is exchanged to the CVD apparatus and the temperature must be raised again to about 300° C. Moreover, heat treatment must be done twice, annealing and alloying. Still more, between the sapphire substrate and gallium nitride semiconductor crystal, the difference in both lattice constant and coefficient of thermal expansion is large, and when thermal impact of heat treatment and returning to room temperature is repeated, expansion and contraction are repeated, and crack, crystal defect or dislocation occurs in the buffer layer contacting with the sapphire substrate, and such crystal defect or dislocation may propagate also to the active layer of clad layer or active layer, and the luminous efficiency is lowered, and he life may be also shortened.

In this method, etching of the laminated semiconductor layers is needed for forming electrodes, but the temperature must be over 250° C. in wet etching, or the luminous surface cannot be etched vertically, and therefore, dry etching is done, which is reactive ion etching by chlorine plasma. However, on the surface etched by dry etching, damage is left over, and the surface of the gallium nitride compound semiconductor surface is more easily oxidized by the damage, and the surface level fluctuates. Accordingly, the electric characteristic after electrode forming is lowered, and the luminous efficiency drops.

Moreover, in such method, there is a problem on the side face of the etched chip, and the light guide in the chip does not work as resonator, and the SLD and LD of higher practical or applicable value cannot be manufactured in the same method. That is, in the LD, the resonator must be formed by finishing the side face of the light guide in a smooth surface to be used as reflection plane, but sufficient smoothness is not achieved at least on the chip side face on which the light guide is exposed, or the side face is inclined, and the confronting sides re not strictly parallel.

SUMMARY OF THE INVENTION

It is a first object of the invention to present a manufacturing method of semiconductor light emitting element capable of shortening the manufacturing process while enhancing the luminous efficiency and life, by suppressing occurrence of crystal defect or dislocation due to mismatching of lattice constant or difference is coefficient of thermal expansion, owing to heat cycle in the manufacturing process.

It is a second object of the invention to present a manufacturing method of semiconductor light emitting element enhanced in electric characteristic and luminous efficiency, capable of obtaining connection of electrodes and semiconductor layer in a stable state without oxidation of the layer on which electrodes are formed even after the semiconductor layer is damaged by dry etching, owing to etching of the semiconductor layer.

It is a third object of the invention to present a gallium nitride compound semiconductor light emitting element enhanced in luminous characteristic by a resonator formed in a light guide, by finishing the etched side face in a smooth surface, being vertical to the substrate surface, by solving the problem that the resonator necessary in LD or the like is not obtained, and a method of manufacturing the same.

To achieve the first object, the invention presents a manufacturing method of semiconductor light emitting element comprising the steps of:

(a) laminating a gallium nitride compound semiconductor layer for forming a luminous part on a substrate comprising at least an n-type layer and a p-type layer, by organic metal compound vapor phase growth method;

(b) filling the gallium nitride compound semiconductor layer in a nitrogen gas atmosphere after laminating, and lowering the ambient temperature to the temperature for growing a GaAs compound in vapor phase and annealing the p-type layer of the gallium nitride compound semiconductor;

(c) forming a film of at least one type selected from the group consisting of GaAs, GaP, InAs, InP, all doped with Mg, and part of these group III elements replaced by Al on the surface of the gallium nitride compound semiconductor layer, as a protective layer in the nitrogen atmosphere; and (d) annealing the p-type layer of gallium nitride compound semiconductor layer together with the protective film, and lowering to room temperature after annealing, and removing the protective film by etching.

Herein, the luminous part is a portion for emitting light by bonding of electrons and holes of pn unction, or active layer of double hetero junction.

According to this manufacturing method, after laminating the gallium nitride compound semiconductor layer in MOCVD process, the atmosphere is immediately replaced by nitrogen atmosphere and the temperature is lowered to about 700° C., and it is annealed while forming a compound semiconductor layer of Mg doped arsenic gallium as protective layer, so that the surface of the gallium nitride compound semiconductor layer is coated with a compound of group III elements such as Ga and As and group V elements, and $N_2$ and other group III elements and group V elements are present in the atmosphere as organic compound, working as an effective mask, so that annealing can be done without allowing escape of Ga or N from the gallium nitride compound semiconductor layer. Accordingly, not requiring the CVD process for forming a protective film after MOCVD, and the heat treatment process is required only once for MOCVD. As a result, without repetition of temperature change or exposure to thermal impact, crystal defect or dislocation hardly occurs, and the luminous efficiency is enhanced together with the reliability.

It is preferred to feed the material gas so that the protective film may be formed in a thickness of about 0.1 μm to about 2 μm by matching the film forming time with the annealing time, so that the materials of Ga and other group III elements and group V elements are present as gas, not limited to $N_2$ alone, in the atmosphere during the annealing process, thereby suppressing evaporation of Ga or N from the gallium nitride compound semiconductor.

To achieve the first object, the invention presents other manufacturing method comprising the steps of:

(e) laminating a gallium nitride compound semiconductor layer having a luminous layer on a substrate comprising at least n-type layer and p-type layer;

(f) forming n side electrode and p side electrodes to be electrically connected to the n-type layer and p-type layer; and (g) heating after forming the both electrodes, thereby annealing the p-type layer and alloying the electrodes and semiconductor layer simultaneously.

According to this manufacturing method, while annealing, the both n side and p side electrodes can be alloyed with the surface of the compound semiconductor layer at the same time, and therefore the annealing step and electrode alloying step can be combined in one process, so that the number of processes can be decreased. Moreover, it is not necessary to heat again the compound semiconductor layer once cooled to low temperature, and it is hence possible to suppress occurrence of crystal defect or dislocation of the gallium nitride compound semiconductor layer caused by repetition of thermal expansion and contraction of the gallium nitride compound semiconductor laminated on a substrate of different material.

In the manufacturing method of semiconductor light emitting element, a sapphire substrate is used as the substrate, one of the n side electrode and p side electrode is formed on the surface of the laminated compound semiconductor layer, and part of the compound semiconductor layer laminated with the other electrode is etched, thereby forming an exposed surface of n-type layer or p-type layer to be electrically connected with the other electrode.

Since the surface of the compound semiconductor layer is coated with a protective film before heat treatment, N and Ga in the gallium nitride compound semiconductor layer can hardly escape, and it is also preferable because the electrode material is not melted to flow away if the melting point of the electrode material is lower than the annealing temperature.

To achieve the second object, the invention presents a manufacturing method of semiconductor light emitting element characterized by laminating a gallium nitride compound semiconductor layer having a luminous part on a substrate comprising at least n-type layer and p-type layer, etching at least part of the laminated semiconductor layer, and forming n side electrode and p side electrode on the surface of the etched and exposed semiconductor layer and laminated semiconductor layer, wherein the entire exposed surface of the semiconductor layer is subjected to sulfide treatment after etching the semiconductor layer.

According to this method, by sulfide treatment after etching process, a sulfide is formed on the surface of the semiconductor layer damaged by dry etching, and therefore the surface is stable and oxidation is hardly promoted. Moreover, the sulfide is easily decomposed at high temperature over 300° C., and it can be eliminated at the time of heat treatment for alloying treatment after forming electrodes. As a result, there is no oxide film after heat treatment for alloying the electrodes, and a stable ohmic contact is obtained in the connection between the electrode metal and semiconductor layer. Hence, the VI (voltage to current) characteristic is notably enhanced.

As the method of sulfide treatment, the substrate laminating the etched semiconductor layer is immersed in $(NH_4)_2S_x$ saturated aqueous solution or saturated aqueous solution of $P_2S_5$ mixed in $(NH_4)_2S_x$ aqueous solution, and a thin film (protective film) of compound with sulfur is formed on the injured area of the semiconductor layer and on the entire exposed surface, thereby preventing oxidation of the exposed surface. By mixing $P_2S_5$, sulfur molecules (atoms) are more likely to deposit on the semiconductor layer surface.

To achieve the third object, the invention presents a semiconductor light emitting element composed of gallium nitride compound semiconductor layer laminated on the R plane or M plane of a sapphire substrate.

Herein, the C plane, R plane, and M plane of the sapphire substrate are defined as follows:

The principal plane of the sapphire substrate is C plane of the single crystal sapphire or (0001) plane, R plane is (1102) plane, and M plane is (1010) plane. The crystal plane names of the single crystal sapphire are shown in FIG. 6(a), (b) and (c).

When the gallium nitride compound semiconductor layer possesses the (0001) plane of gallium nitride as the side surface vertical to the sapphire substrate, it is preferred because the side surface can be used as the smooth surface of the light guide in the semiconductor light emitting element.

According to the semiconductor light emitting element to achieve the third object of the invention, since the gallium nitride compound semiconductor layer is grown on the substrate of which principal plane is the R plane or M plane of sapphire crystal, it is possible to etch along the (0001) plane of the gallium nitride compound semiconductor layer, and the side surface vertical to the substrate may be easily formed as a smooth surface. Therefore, both end surfaces of the light guide in the semiconductor light emitting element formed of the gallium nitride compound semiconductor layer are smooth surfaces of high quality, and an optical resonator of high degree of completion can be manufactured. As a result, blue LED of high luminance, superluminescent diode, and semiconductor laser can be realized.

To achieve the third object, the invention presents a manufacturing method of semiconductor light emitting element comprising the steps of:

(h) preparing a sapphire substrate of which principal plane is R plane or M plane;

(i) laminating a gallium nitride compound semiconductor buffer layer on the principal plane of the sapphire substrate;

(j) sequentially laminating a lower clad layer, an active clad layer, an upper clad layer, and a cap layer composed of gallium nitride compound semiconductor on the buffer layer by matching crystal lattice;

(k) etching vertically to the sapphire substrate, along the (0001) plane of the gallium nitride compound semiconductor layer matched in crystal lattice, and exposing the buffer layer;

(l) forming a metal film;

(m) forming an electrode on the cap layer and the buffer layer exposed by etching, by patterning the metal film; and (n) separating the chip into every element by dicing.

DETAILED DESCRIPTION

Figure 1A:
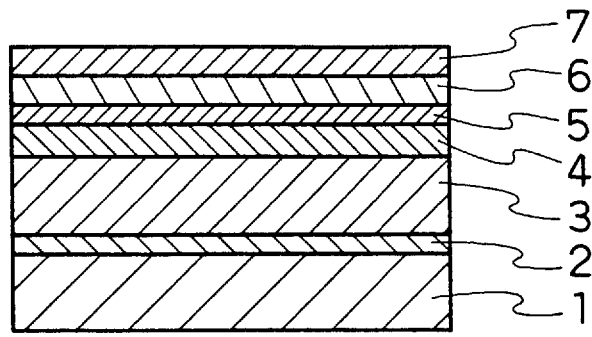
FIGS. 1(a) to 1(d) are diagrams showing the manufacturing process of first and third embodiments of manufacturing method of semiconductor light emitting element of the invention.

Referring now to the drawings, the semiconductor light emitting element of the invention and its manufacturing method are described below.

EXAMPLE 1

Referring first to FIGS. 1(a) to 1(d), an embodiment of manufacturing method of semiconductor light emitting element of the invention is described.

First, as shown in FIG. 1(a), on a substrate 1 made of sapphire or the like, a low temperature buffer layer 2 of gallium nitride compound semiconductor layer such as n-type GaN is grown by MOCVD method at 400° C. to 700° C., and a high temperature buffer layer 3 at 700° C. to 1200° C., respectively by about 0.01 $\mu$m to about 0.2 $\mu$m and 2 to 5 $\mu$m. Afterwards, an n-type clad layer 4, a non-doped n-type or p-type active layer 5, a p-type clad layer 6, and a cap layer 7 are laminated sequentially. The clad layers 4, 5 are usually formed in a thickness of about 0.1 $\mu$m to about 0.3 $\mu$m, and the active layer 5, about 0.05 $\mu$m to about 0.1 $\mu$m. These films of the gallium nitride compound semiconductor layer are formed by feeding the same material gas as in the prior art, and growing by reaction.

To form the clad layer 4 in n-type, Si, Ge, Te or Sn is mixed into the reaction gas in a gas form of $SiH_4$, $GeH_4$, $TeH_4$, $SnH_4$ and to form the clad layer 6 in p-type, Mg or Zn in mixed in the material gas in a form of organic metal gas such as $Cp_2Mg$ or DMZn. The cap layer 7 is the layer for ohmic contact with the electrode metal, being composed of a p-type GaN or the like, and is formed in a thickness of 0.2 $\mu$m or more.

After laminating the gallium nitride compound semiconductor layers, by replacing with nitrogen gas atmosphere, the ambient temperature is lowered to about 550° C. to about 800° C. so as to be ready to grow GaAs compound in vapor, and anneal the p-type layer of the gallium nitride compound semiconductor layer. Herein, the nitrogen gas atmosphere is required in order to prevent N from escaping from the GaN layer. Or, Ga may also escape, and hence, for example, a protective film 10 of GaAs, GaP, InAs, InP, or part or whole of III group elements of these compounds replaced with Al is formed in a thickness of about 0.1 $\mu$m to about 2 $\mu$m by MOCVD method (see FIG. 1(b)). Together with forming of the protective film 10, the p-type layer of the gallium nitride compound semiconductor layer is annealed, and the H compounded with dopant Mg is isolated and released outside, and the p-type layer is lowered in electric resistance. After forming the protective film 10, annealing may be also continued at the same temperature in $N_2$ atmosphere, but by adjusting the flow rate of the reaction gas so that the protective film may be formed by about 0.1 $\mu$m to about 2 $\mu$m in the same 30 to 60 minutes of the protective film 10 forming time and annealing time, it is preferable because organic gases of group III and group V elements are present in the atmosphere while annealing, so that any element of the composition hardly escapes from the gallium nitride compound semiconductor layer.

Afterwards, when annealing is complete cooling to room temperature, the protective film 10 is removed by wet etching. The etching condition varies with the material of the protective film, and for example in the case of GaAs, GaP layer, the etchant is a mixed solution of sulfuric acid and hydrogen peroxide water, or a mixed solution of nitric acid and hydrochloric acid, and the etching temperature is about 10° C. to about 50° C., and the time is about 1 minute to about 10 minutes. In the case of InAs, InP layer, the etchant is a mixed solution of sulfuric acid and hydrogen peroxide water, or a mixed solution of hydrochloric acid and hydrogen peroxide water, the etching temperature is 10° C. to 50° C., and the time is 1 minute to 10 minutes.

As a result, junction with p-type layer dopants Mg and H is cut off, and activation is achieved, thereby forming a laminate film of gallium nitride compound semiconductor comprising at least n-type layer and p-type layer lowered in the electric resistance of p-type layer.

Figure 1B:
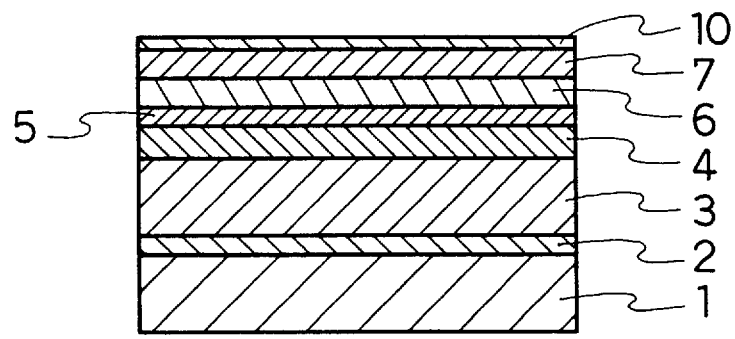
Figure 1C:
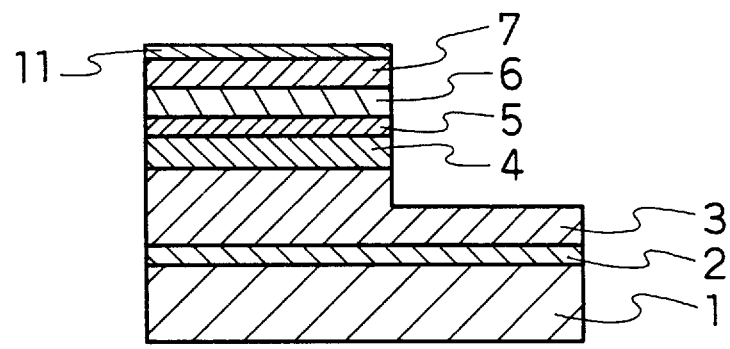

To form the n side electrode, consequently, applying resist and patterning, as shown in FIG. 1(c), part of the gallium nitride compound semiconductor layer is removed by dry etching from an opened portion of a resist film 11, and a high temperature buffer layer 3 which is an n-type GaN layer is exposed. Forming a metal film of Au or Al by sputtering or the like, a p side electrode 8 to be connected electrically to the p-type layer is formed on the laminated surface of the compound semiconductor layer, and an n side electrode 9 to be connected electrically to the n-type layer, on the exposed surface of high temperature buffer layer 3 (see FIG. 1(d)). By dicing each chip, LED chips are formed.

The example relates to the LED of double hetero junction, but the invention may be similarly applied to the LED of ordinary pn junction or the laser diode of various structures, as far as the gallium nitride compound semiconductor is used. The gallium nitride compound semiconductor is not limited to the composition of the material mentioned above, and generally it may be composed of $Al_pGa_qIn_{1-p-q}N$ (0<p≦1, 0<p+q≦1), and the composition may be varied by selecting p and q so that the ratio of each composition may be selected so that, for example, the band gap energy of the active layer may be smaller than the band gap energy of the clad layer. The invention is similarly applicable to the material in which part or whole of $Al_pGa_qIn_{1-p-q}N$ is replaced by As and/or P.

According to the manufacturing method of semiconductor light emitting element of embodiment 1, the annealing process of p-type compound semiconductor layer, and the protective film forming process onto the surface of the laminated film of the gallium nitride compound semiconductor are done simultaneously, and therefore elements in the gallium nitride compound semiconductor will not escape while annealing, and it is not necessary to form the protective film by once returning to room temperature after forming the film by MOCVD, and hence the number of processes is curtailed and the term of process can be shortened, and moreover crystal defects or dislocation due to repetition of temperature change can be avoided. As a result, an inexpensive semiconductor light emitting element of excellent luminous characteristic and high reliability can be obtained.

EXAMPLE 2

FIGS. 2(a) to 2(e) are process sectional explanatory diagrams of other embodiment of manufacturing method of semiconductor light emitting element of the invention.

First, as shown in FIG. 2 (a), same as in example 1, on a substrate 1 of sapphire or the like, a low temperature buffer layer 2, a high temperature buffer layer 3, an n-type clad layer 4, an active layer 5, a p-type clad layer 6, and a gap layer 7 are laminated.

In succession, part of each semiconductor layer is dry etched by, for example, $Cl_2$ plasma, and the high temperature buffer layer 3 is exposed. By forming a metal film of Au, Al or the like by sputtering, and patterning, consequently, a p side electrode 8 to be connected electrically to the p-type layer is formed on the laminated surface of the compound semiconductor layer, and an n side electrode 9 to be connected electrically to the n-type layer, on the exposed surface of the high temperature buffer layer 3 (see FIG. 2(b)).

Figure 2A:
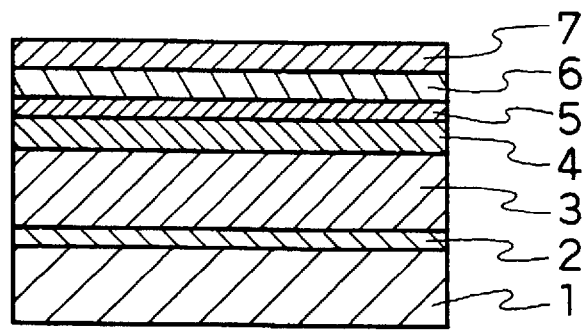
FIGS. 2(a) to 2(e) are diagrams showing the manufacturing process of a second embodiment of manufacturing method of semiconductor light emitting element of the invention.
Figure 2B:
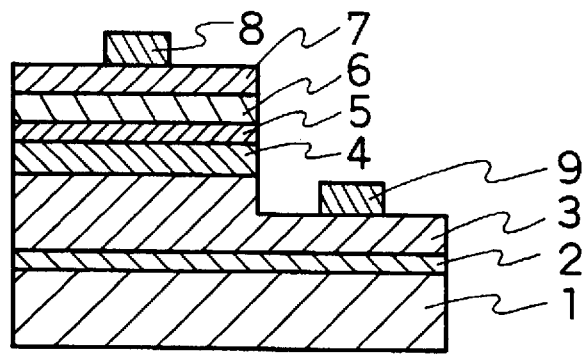
Figure 2C:
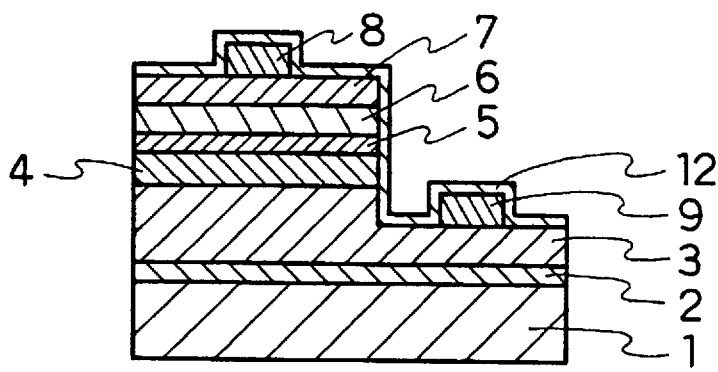
Figure 2D:
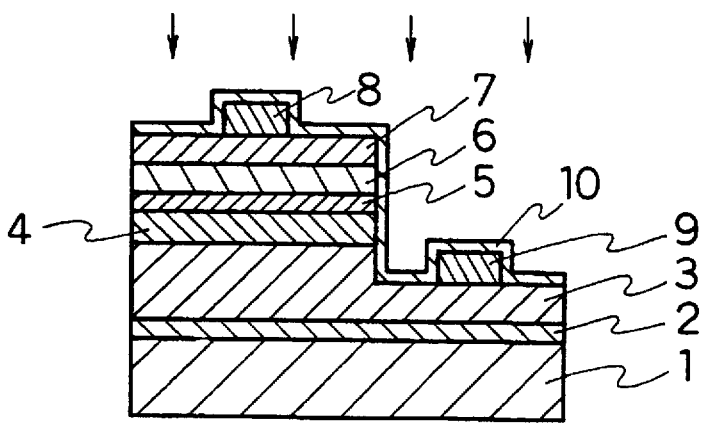

After forming the electrodes 8, 9, a protective film 12 of $SiO_2$, $Si_3N_4$, or the like is formed on the surface of the semiconductor layer by CVD method or PCVD method (see FIG. 2(c)), and is annealed (see FIG. 2(d)). The annealing process is done in $N_2$ atmosphere, at 400° C. to 800° C., for about 0.5 hours to about 1 hour. According to this method, since the protective film 12 is present, it is preferable because N or G hardly escapes from the gallium nitride compound, but the same effects are obtained by the annealing method at about 400° C. to about 800° C. in the $N_2$ atmosphere at high pressure of about 10 atm. It is, however, more preferable when the protective film is formed because alloying is done sufficiently without flowing away at the time of heat treatment if the melting temperature of the electrode material is lower than the heat treatment temperature. As a result, junction with p-type layer dopants Mg and H is cut off, and activation is achieved, and the p-type layer is lowered in electric resistance. Moreover, alloying of electrode and semiconductor layer can be done at the same time, and an ohmic contact can be attained.

Figure 2E:
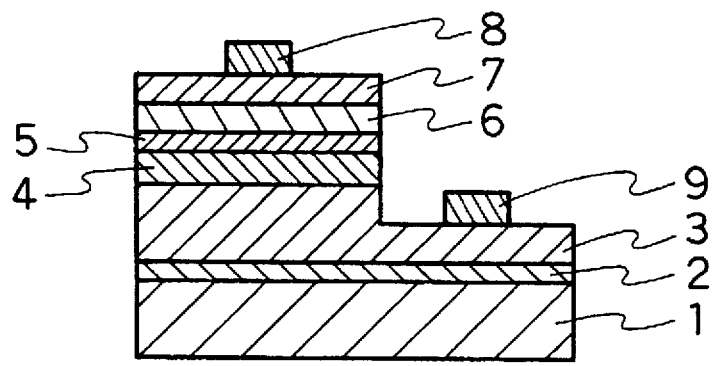

After the annealing process, the protective film 12 is removed by etching in a hydrofluoric acid solution, and separating into each chip, the semiconductor light emitting element chip as shown in FIG. 2(e) is formed.

By installing this semiconductor light emitting element chip in the lead frame, wire bonding, and molding with epoxy resin, an LED is completed.

In this example, the electrodes 8 and 9 are formed at the surface side of the cap layer 7, but they can be formed in a conductive property by using semiconductor substrate composed of GaAs or GaN derivative as the substrate 1, and the electrodes can be formed also on the back side of the compound semiconductor layer, or the substrate 1 side.

This example relates to an LED of double hetero junction of $Al_xGa_{1-x}N$ or $Ga_yIn_{1-y}N$, but an LED of ordinary homo- or hereto-pn junction may be formed or a laser diode may be composed by forming striped in the same structure, or the material may be changed to satisfy the general formula of $Al_pGa_qIn_{1-p-q}N$ ($0<p\leq1$, $0<p+q\leq1$) so as to satisfy the refractive index or relation of band gap energy by the gallium nitride compound semiconductor, or the composition having part or whole of N in this formula replaced by As and/or P may be also manufactured in the same process as in example 1.

According to the manufacturing method of example 2, the annealing process of the p-type compound semiconductor layer and alloying process of electrodes can be done by one session of heat treatment, and hence crystal defect or dislocation caused by repetition of temperature difference can be prevented, and a semiconductor light emitting element of excellent luminous efficiency and high reliability can be obtained. Besides, since the heat treatment is required only once, and the heat treatment process can be curtailed and the cost can be reduced.

EXAMPLE 3

This example is also manufactured in the same process as shown in FIGS. 1(a) to 1(d), and is explained by reference to FIGS. 1(a) to 1(d).

First, as shown in FIG. 1(a), same as in example 1, on a substrate 1 of sapphire or the like, a low temperature buffer layer 2, a high temperature buffer layer 3, an n-type clad layer 4, an active layer 5, a p-type clad layer 6, and a gap layer 7 are laminated.

Figure 8A:
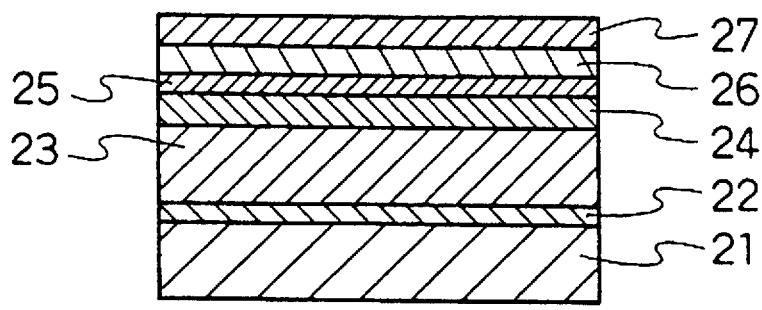
FIGS. 8(a) through 8(e) are diagrams showing the manufacturing process of the semiconductor light emitting element in FIG. 7.
Figure 8B:
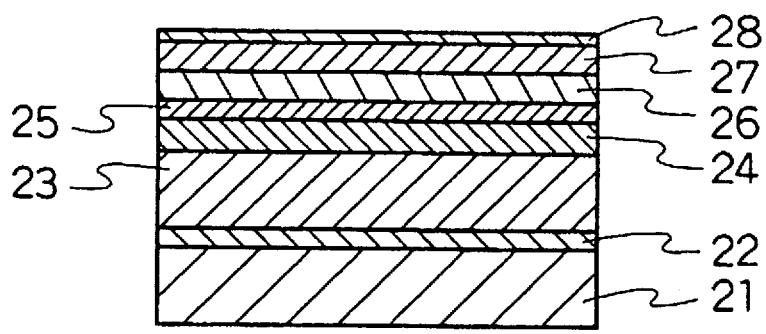
Figure 8C:
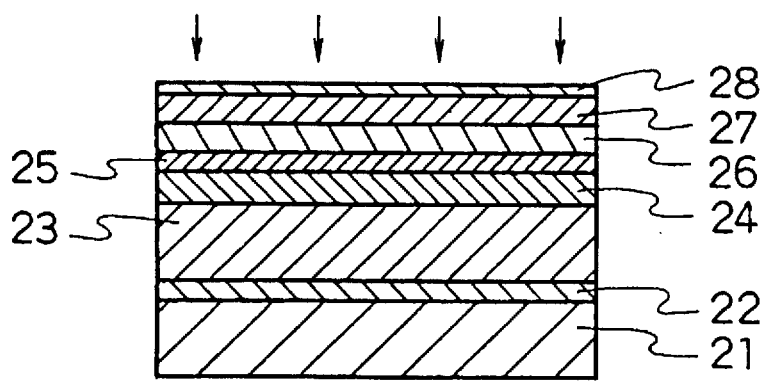
Figure 8D:
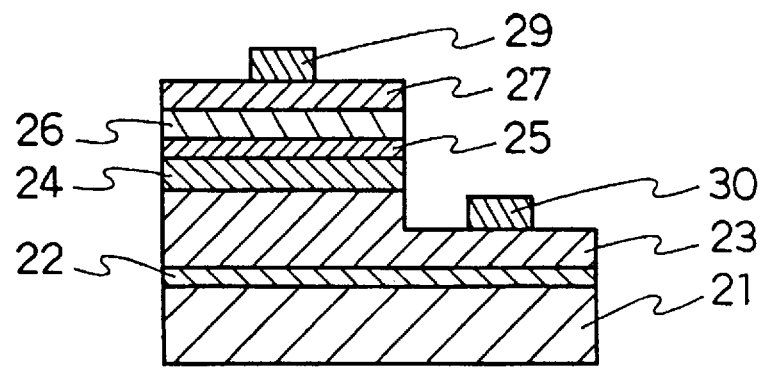
Figure 8E:
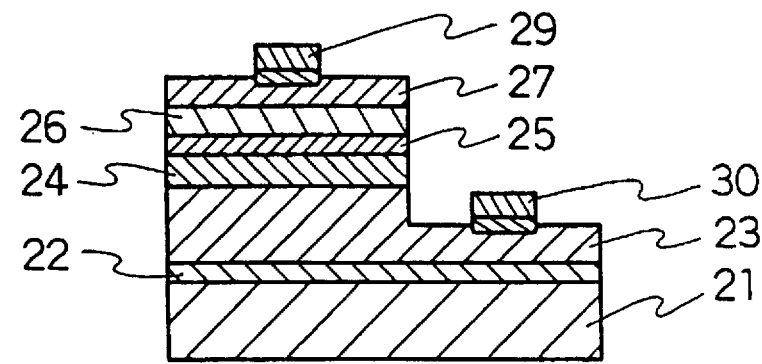

Then, annealing process may be executed same as in the process in FIG. 1(b) in example 1, but as in the method shown in FIGS. 8(b), (c), a protective film of $SiO_2$ or $Si_3N_4$ may be formed on the entire surface of the growth layer of the semiconductor layer, and it is annealed for about 20 minutes to about 60 minutes at 400° C. to 800° C. to activate the p-type clad layer 6 and cap layer 7.

After completion of annealing, lowering the temperature at about 10° C. to about 40° C. or room temperature, the protective film is removed by wet etching by using hydrofluoric acid solution or the like.

As a result, same as in example 1, junction with the p-type layer dopants Mg and H is cut off, and activation is achieved, so that the p-type layer is lowered in electric resistance.

In succession, to form an n side electrode on the gallium nitride compound semiconductor layer, same as in example 1, as shown in FIG. 1(c), part of gallium nitride compound semiconductor layer is removed by dry etching by $Cl_2$ gas plasma, and the high temperature buffer layer 3 which is an n-type GaN layer is exposed. At this time, chlorine ions violently collide against the gallium nitride compound semiconductor to react, and hence the gallium nitride compound semiconductor layer is damaged, and the surface becomes unstable.

Afterwards, the substrate on which the etched semiconductor layer is laminated is immersed for about 1 minute to about 10 minutes in a saturated aqueous solution of ammonium monosulfide or polyammonium sulfide $(NH_4)_2S_x$ (for example, x=1, 2, 3, 4, 5, 9) or saturated aqueous solution mixing $P_2S_5$ in $(NH_4)_2S_x$ aqueous solution, and is lifted from the aqueous solution, and dried. A side from these aqueous solutions, any aqueous solution containing free soluble sulfides such as $As_2S_5$ and $GeS_2$ may be used. By thus immersing, the entire exposed surface of the semiconductor layer is covered with sulfide, and on the surface, S is compounded with unstable G or N due to damage of the gallium nitride compound semiconductor layer, and a sulfide is formed on the surface, thereby forming a stable surface hardly compounded with oxygen.

Or, concerning the semiconductor layer of gallium nitride compound not being etched, on the exposed area, S deposits as sulfide, and hence the material is not changed by oxidation.

Successively, same as in example 1, a metal film of Au or Al is formed by sputtering, and a p side electrode 8 to be connected electrically to the p-type layer is formed on the laminated surface of compound semiconductor layer, and an n side electrode 9 to be connected electrically to the n-type layer, on the exposed surface of high temperature buffer layer 3. Afterwards, forming a protective film on the luminous part other than the electrode area on the surface, heat treatment is done as required for alloying the electrodes and semiconductor layer (see FIG. 1(d)). The protective film is composed of, for example, $SiO_2$, $Si_3N_4$, and $Al_2O_3$, and is intended to protect the semiconductor layer from water or oxygen in the air, and is formed in a proper thickness not objectionable to luminous efficiency.

By dicing each chip, LED chips are formed, and by mounting on the lead frame, bonding, and molding, an LED is formed.

It is a feature of the example that the surface of the semiconductor layer undergoes nitride treatment by immersing the substrate laminated with gallium nitride compound semiconductor layer in saturated aqueous solution of $(NH_4)_2S_x$ or the like after dry etching. Accordingly, compounding with unstable Ga or N due to damage by dry etching, a sulfide is formed, and deposited on the surface of the semiconductor layer to prevent compounding with oxygen or the like, thereby holding a stable surface.

Figure 4:
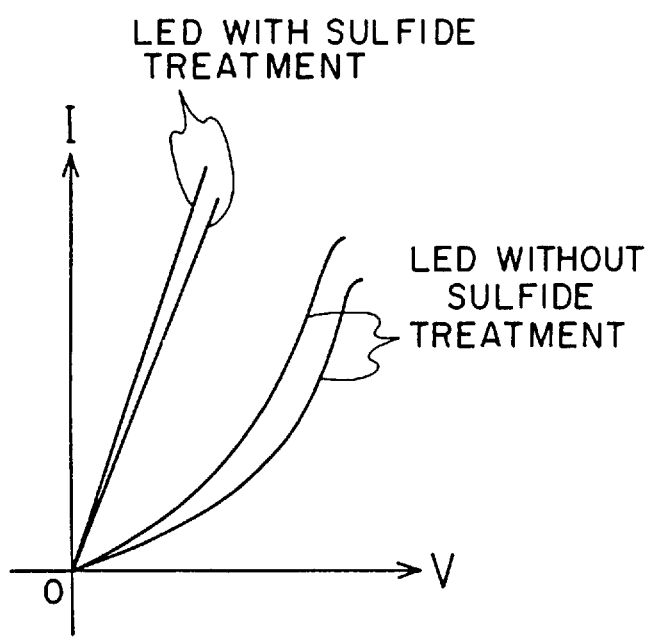
FIG. 4 is a voltage to current characteristic diagram of LED by a conventional manufacturing method in the same structure as the LED of the third embodiment.

On the other hand, when electrodes and the like are formed on the surface, if later heated to over 400° C. for alloying process, the sulfides are easily decomposed and evaporated. Hence, no sulfide or oxide is left over between the electrodes and semiconductor layer, and a pure alloy of electrode metal and semiconductor layer is formed, and the electric resistance is not increased, and the voltage to current characteristic is improved. FIG. 4 shows the voltage to current characteristic of the compositions with and without sulfide treatment of the invention. The LED of the invention has no oxide between the electrodes and the semiconductor layer, and hence electric resistance loss is not caused, and more current can be obtained at a same voltage, so that a higher luminous output is obtained.

Figure 3:
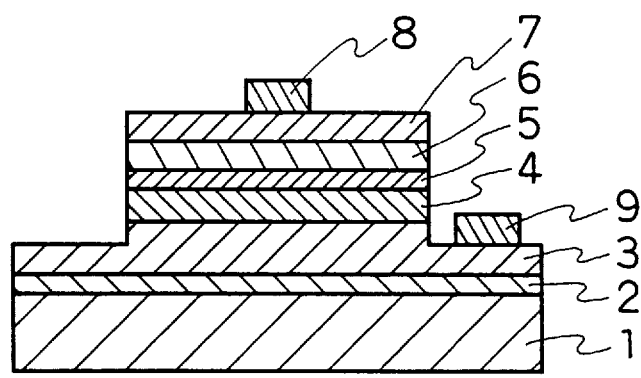
FIG. 3 is a sectional explanatory diagram of different structure of LED applied to the third embodiment of manufacturing method of semiconductor light emitting element of the invention.

FIG. 3 shows an LED emitting light from the side of the laminated semiconductor layer, or a side emission LED, and in order to etch vertically to the semiconductor layer, in the smooth side surface, therefore, in the LED or LD in such structure, strict etching is done, and the semiconductor layer has a greater damage by etching, but in the invention, since the entire surface undergoes sulfide treatment after dry etching, a semiconductor light emitting element of high characteristic is obtained.

Example 3 also relates to the double hetero junction LED, but same as in the foregoing examples, the invention is also applicable to the ordinary pn junction LED or LD of various structures, as far as gallium nitride compound semiconductor is used. Moreover, the gallium nitride compound semiconductor is not limited to the material of the composition mentioned above, and generally a material of $Al_pGa_qIn_{1-p-q}N$ ($0<p\leqq1$, $0<p+q\leqq1$) with proper p and q selected can be used, same as in the other examples.

According to the manufacturing method of example 3, the entire semiconductor layer is subjected to sulfide treatment after dry etching, and hence a sulfide is formed on the exposed surface which is unstable by damage due to dry etching, and the exposed surface is not oxidized, and therefore the voltage-current characteristic is maintained at high level, and the luminous characteristic of the luminous part is not lowered. That is, by a simple processing, a semiconductor light emitting element of excellent luminous efficiency, stable light emission volume, and high reliability can be obtained.

EXAMPLE 4

Referring now to FIG. 5, a semiconductor layer and its manufacturing method are explained as an example of semiconductor light emitting element of the invention and other example of its manufacturing method.

Figure 5A:
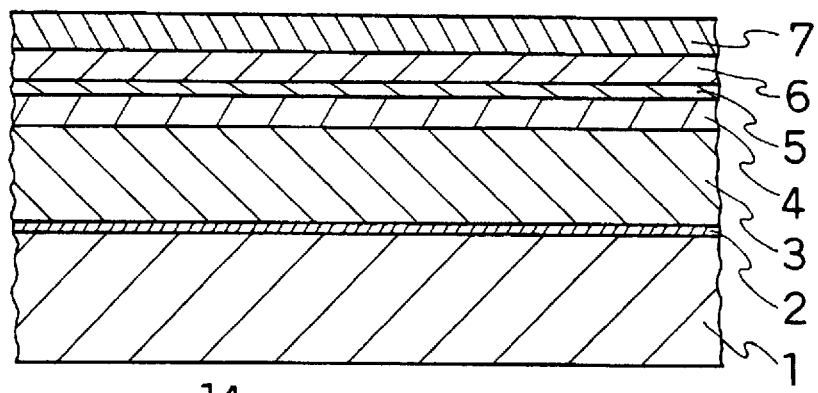
FIGS. 5(a) through 5(e) are diagrams showing the manufacturing process in a fourth embodiment of manufacturing method of semiconductor light emitting element of the invention.

First, a sapphire substrate 1 of which principal plane is R plane or M plane is prepared, and as shown in FIG. 5(a), same as explained in the prior art, an organic metal gas and an impurity gas are fed, and films are formed by MOCVD method. On the sapphire substrate 1, a low temperature buffer layer 2 of n-type GaN is formed in about 0.01 $\mu$m to about 0.2 $\mu$m, a high temperature buffer layer 3 of n-type GaN in about 2 $\mu$m to about 5 $\mu$m at 700° C. to 1200° C., a lower clad layer 4 of n-type $Al_xGa_{1-x}N$ ($0<y<1$) in about 0.1 $\mu$m to about 0.3 $\mu$m, an active layer 5 of a material of which band gap energy is smaller than that of clad layer, for example, non-doped $Ga_yIn_{1-y}N$ ($0<y\leqq1$) in about 0.05 $\mu$m to about 0.1 $\mu$m, an upper clad layer 5 of p-type $Al_xGa_{1-x}N$ in about 0.1 $\mu$m to about 0.3 $\mu$m, and a cap layer 7 of p-type GaN in about 0.3 $\mu$m to about 2 $\mu$m, by growing continuously. Crystal defects can be decreased by forming the high temperature buffer layer after forming the low temperature buffer layer.

At this time, the (0001) crystal plane of the GaN film is in the direction vertical to the substrate 1. This is because the principal plane of the sapphire substrate 1 is R plane or M plane.

The active layer is held by a set of (0001) plane side surfaces vertical to the sapphire substrate, and at least one end surface is a luminous surface, which is preferable because the light guide can be used as a light resonator.

Figure 5B:
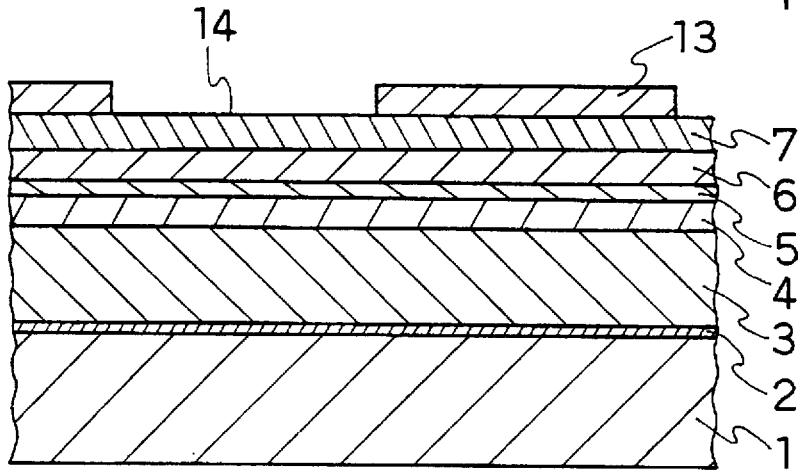

Next, as shown in FIG. 5(b), on the laminated surface of the semiconductor layer, for example, a resist film 13 is applied in a thickness of 0.3 $\mu$m to 3 $\mu$m, and it is patterned so that the etching portion of the semiconductor layer may be opened. This patterning is done so that the side wall of the opening 14 may come to the surface of the substrate, that is, substantially in the direction vertical to the laminated surface of the semiconductor layer.

Figure 1D:
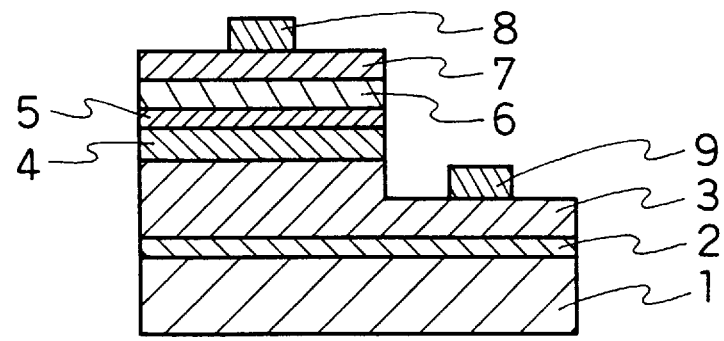
Figure 5C:
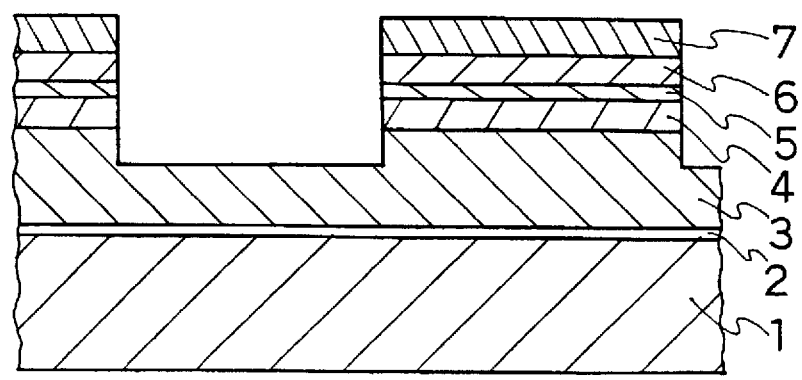
Figure 5D:
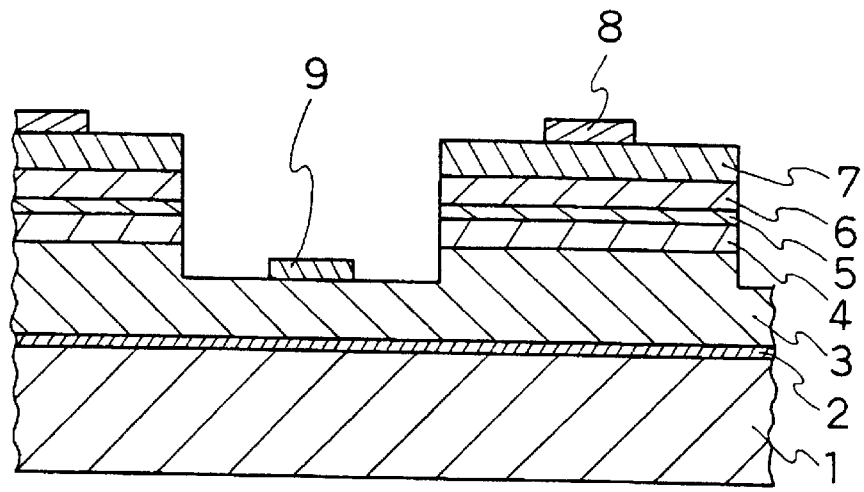

Afterwards, by reactive ion etching in, for example, $Cl_2$ gas atmosphere, as shown in FIG. 5(c), the n-type high temperature buffer layer 3 is exposed through the active layer 5. By this etching, the side surface of the semiconductor light emitting element is formed, and at this time it is designed in advance so that the luminous surface for exposing the active layer and the confronting end face through the light guide may be the (0001) plane of $Ga_yIn_{1-y}N$ film. Therefore, these end surfaces are smooth surfaces of high quality. In succession, by forming a metal film of Au or Al on the face and patterning, a p side electrode 8 and an n side electrode 9 are formed respectively on the cap layer 7 and etched and exposed high temperature buffer layer 3 (see FIG. 5(d)). To form the LED chip same as shown in FIG. 1(d), dicing is done successively. In this example, the configuration of the luminous part (p side electrode 8) and n side electrode 9 is inverted from examples 1 to 3, but it does not matter as the light emitting element.

Figure 5E:
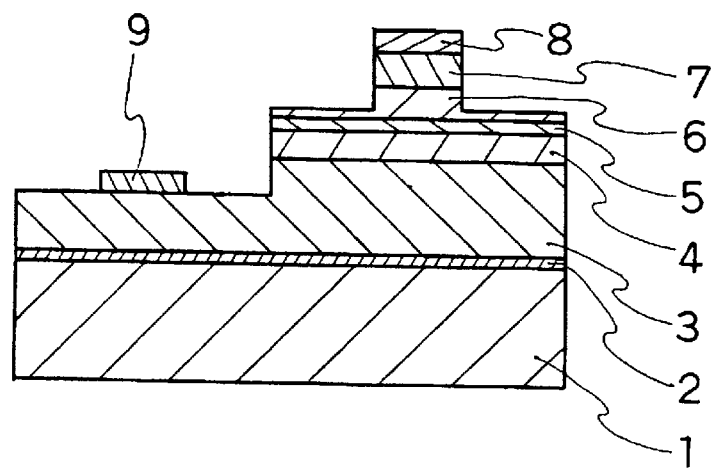
Figure 6A:
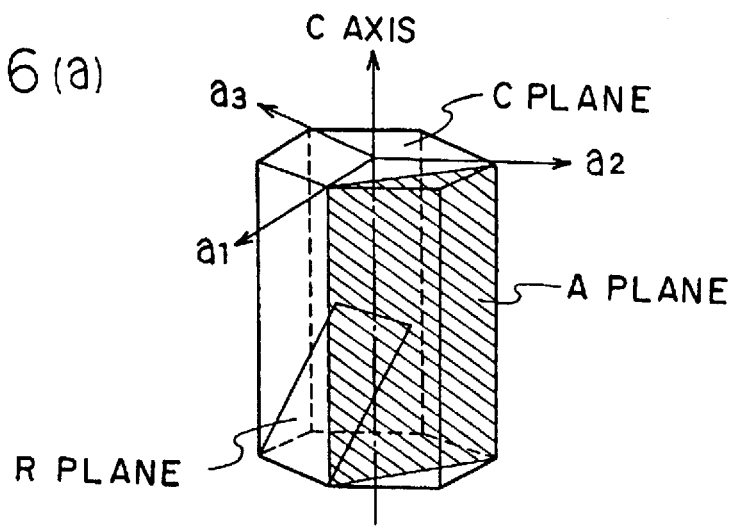
FIGS. 6(a) through 6(c) are diagrams showing the names of crystal planes of single crystal sapphire.
Figure 6B:
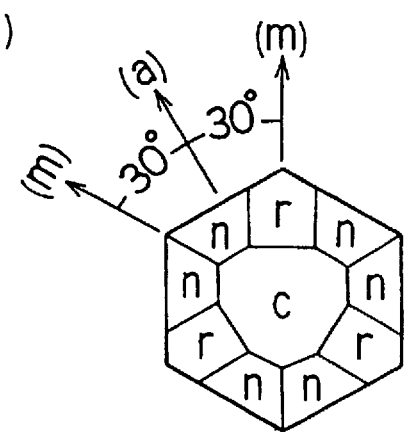
Figure 6C:
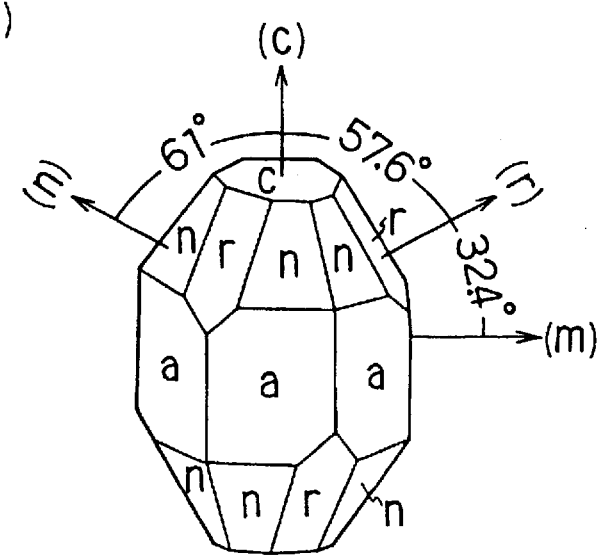
Figure 7:
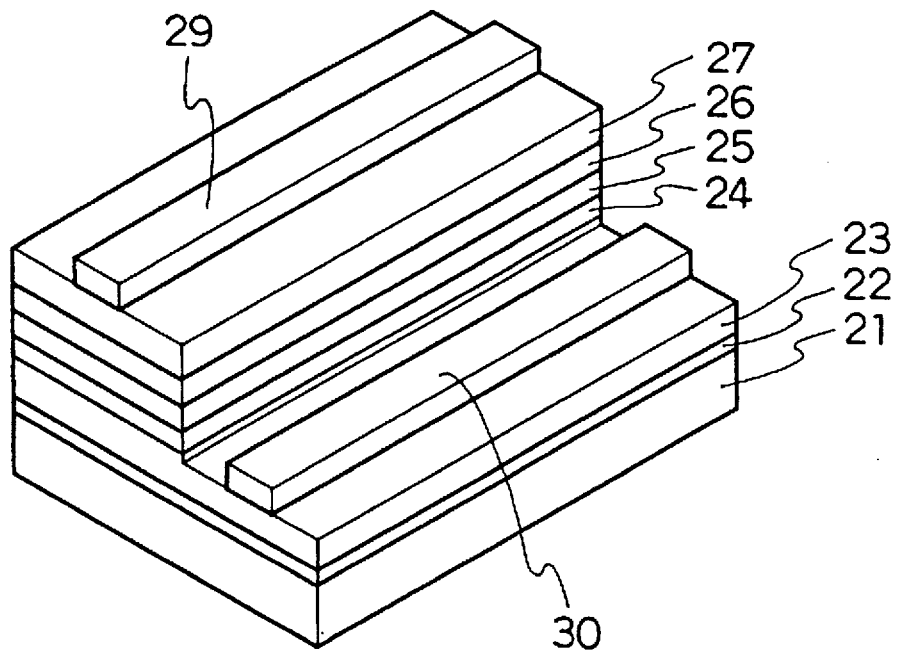
FIG. 7 is a perspective explanatory diagram showing an example of a conventional semiconductor light emitting element.

Or, using the p side electrode 8 as mask, by etching part of the cap layer 7 and upper clad layer 6 by reactive ion etching using argon gas and chlorine gas to form a mesa shape, when the substrate 1 is diced, a chip of semiconductor laser forming stripes in a band form of 4 $\mu$m to 10 $\mu$m on the p side electrode 8 is obtained (see FIG. 5(e)).

According to the invention, the both end faces of the active layer 5 are substantially vertical to the surface of the substrate 1, and the upper and lower sides of the active layer 5 are held by clad layers large in band gap energy, thereby forming a resonator enclosed with smooth surfaces at both ends, and hence a semiconductor laser excellent in luminous efficiency is obtained, and the laser beam emitted from the active layer 5 advances parallel to the substrate surface, and the optical axis matching of the laser beam and condenser lens is easy.

In this example, by mesa etching, an example of semiconductor layer in a stripe form of current injection region is explained, but also in the semiconductor layer in a buried structure or in a structure forming a current blocking layer of opposite conductive type forming stripe grooves in the clad layer, for example, end faces vertical to the substrate surface can be formed according to the invention, and a blue semiconductor laser using gallium nitride compound semiconductor layer can be also obtained. The semiconductor material of gallium nitride derivative is not limited to the shown composition, but any other gallium nitride compound semiconductor may be used same as in the foregoing examples.

According to the semiconductor light emitting element and its manufacturing method of the invention, the end face cut out vertically to the substrate by etching can be formed on the (0001) plane of gallium nitride compound semiconductor film, and by selecting this surface as the both end faces of the light guide, a light resonator enclosed by smooth surfaces of high quality is fabricated, and even in the semiconductor light emitting element using gallium nitride compound semiconductor layer formed on a substrate that cannot be cleaved, such as sapphire substrate, a semiconductor layer of excellent characteristic, or side emitting LED can be obtained.

Though several embodiments of the present invention are described above, it is to be understood that the present invention is not limited only to the above-mentioned and various changes and modifications may be made in the intention without departing from the spirit and scope thereof.

What is claimed is:

1. A manufacturing method of a semiconductor light emitting element comprising the steps of:

(a) laminating a gallium nitride compound semiconductor layer for forming a luminous part on a substrate comprising at least an n-type layer and a p-type layer, by organic metal compound vapor phase growth method;

(b) placing the gallium nitride compound semiconductor layer in a nitrogen gas atmosphere after laminating, lowering an ambient temperature to a temperature for growing a GaAs compound in vapor phase and annealing the p-type layer of the gallium nitride compound semiconductor layer;

(c) forming a film of at least one type selected from a group consisting of GaAs, GaP, InAs, InP, all doped with Mg, and part of these group III elements replaced by Al on a surface of the gallium nitride compound semiconductor layer, as a protective layer in the nitrogen atmosphere; and (d) annealing the p-type layer of gallium nitride compound semiconductor layer while simultaneously forming the protective film, lowering to room temperature after annealing, and removing the protective film by etching.

2. A manufacturing method of semiconductor light emitting element of claim 1, wherein the material gas is fed so that the protective film may be formed in a thickness of about 0.1 $\mu$m to about 2 $\mu$m by matching the film forming time with the annealing time.

3. A manufacturing method of semiconductor light emitting element comprising the steps of:

(e) laminating a gallium nitride compound semiconductor layer having a luminous layer on a substrate comprising at least n-type layer and p-type layer;

(f) forming n side electrode and p side electrodes to be electrically connected to the n-type layer and p-type layer; and (g) heating after forming the both electrodes, therein annealing the p-type layer and alloying the electrodes and semiconductor layer simultaneously.

4. A manufacturing method of semiconductor light emitting element of claim 3, wherein a sapphire substrate is used as the substrate, one of the n side electrode and p side electrode is formed on the surface of the laminated compound semiconductor layer, and part of the compound semiconductor layer laminated with the other electrode is etched, therein forming an exposed surface of n-type layer or p-type layer to be electrically connected with the other electrode.

5. A manufacturing method of semiconductor light emitting element of claim 3, wherein the surface of compound semiconductor layer and electrodes is covered with a protective film before heat treatment.

6. A manufacturing method of a semiconductor light emitting element comprising the steps of:

(h) preparing a sapphire substrate of which principal plane is R plane of M plane;

(i) laminating a gallium nitride compound semiconductor buffer layer on the principal plane of the sapphire substrate;

(j) sequentially laminating a lower clad layer, an active clad layer, an upper clad layer, and a cap layer composed of gallium nitride compound semiconductor on the buffer layer by matching crystal lattice;

(k) etching vertically to the sapphire substrate, along a (0001) plane of the gallium nitride compound semiconductor layer matched in crystal lattice, and exposing the buffer layer wherein the (0001) plane of the gallium nitride compound semiconductor layer is a side plane vertical to the substrate;

(l) forming a metal film;

(m) forming an electrode on the cap layer and the buffer layer exposed by etching, by patterning the metal film; and (n) separating the chip into every element by dicing.

7. A manufacturing method of semiconductor light emitting element of claim 6, wherein the step of laminating the buffer layer consists of a step of forming a low temperature buffer layer at low temperature, and a step of forming a high temperature buffer layer at high temperature, and the exposed buffer layer is the high temperature buffer layer.

* * * * *